United States Patent [19]
Walker et al.

[11] Patent Number: 4,792,764
[45] Date of Patent: Dec. 20, 1988

[54] NONCONTACT ELECTRONIC SWITCHING ARRANGEMENT

[75] Inventors: Heinz Walker, Kümmersbruck; Hans-Dieter Riedel, Erlangen, both of Fed. Rep. of Germany

[73] Assignee: Siemens Aktiengesellschaft, Berlin & Munich, Fed. Rep. of Germany

[21] Appl. No.: 921,890

[22] Filed: Oct. 21, 1986

Related U.S. Application Data

[63] Continuation of Ser. No. 498,586, May 26, 1983, abandoned.

[30] Foreign Application Priority Data

Jun. 9, 1982 [DE] Fed. Rep. of Germany ....... 3221888

[51] Int. Cl.⁴ ...................... G01N 27/00; G08B 13/16
[52] U.S. Cl. ........................................ 328/5; 307/308; 331/65
[58] Field of Search .................... 328/5, 138; 307/116, 307/139, 143, 308; 331/65

[56] References Cited

U.S. PATENT DOCUMENTS

| | | | |
|---|---|---|---|
| 3,747,012 | 7/1973 | Buck | 331/65 |
| 4,016,453 | 4/1977 | Moenning | 328/5 |
| 4,081,700 | 3/1978 | Hamilton, II | 307/308 |
| 4,135,124 | 1/1979 | Buck | 323/19 |
| 4,328,433 | 5/1982 | Nodera et al. | 328/5 |
| 4,430,636 | 2/1984 | Bruce | 331/65 |

FOREIGN PATENT DOCUMENTS

| | | | |
|---|---|---|---|
| 2317297 | 8/1974 | Fed. Rep. of Germany | 328/5 |
| 2404568 | 8/1974 | Fed. Rep. of Germany | 307/308 |
| 2515654 | 10/1976 | Fed. Rep. of Germany | 328/5 |
| 2618231 | 11/1977 | Fed. Rep. of Germany | 328/5 |

OTHER PUBLICATIONS

H. J. Krimmling and H. Walker, Bero Proximity Switches of IC Design, Siemens Review, vol. 42, No. 10, pp. 453–456, Oct. 1975.
"Theorie und Anwendugen des Phase-Locked Loops" by von Roland Best, Jun. 1975; pp. EL 9–15.

*Primary Examiner*—Stanley D. Miller
*Assistant Examiner*—Timothy P. Callahan
*Attorney, Agent, or Firm*—Kenyon & Kenyon

[57] ABSTRACT

A noncontact electronic switching arrangement is provided with an oscillator which can be damped by external objects. In accordance with the invention, the oscillator can be excited externally and is coupled to an evaluation circuit and an amplifier. A frequency control, which may consist of a phase-locked loop module, is connected to the externally excited resonant circuit of the oscillator. A reference voltage comparator at the output of the oscillator delivers at a Schmitt trigger output, pulse signals to a retriggerable time delay stage, or a shift register, which are connected to an exclusive-OR stage. The functioning of the exclusive-OR stage can be programmed. The arrangement is particularly useful as a limit or end switch for machine tools.

7 Claims, 1 Drawing Sheet

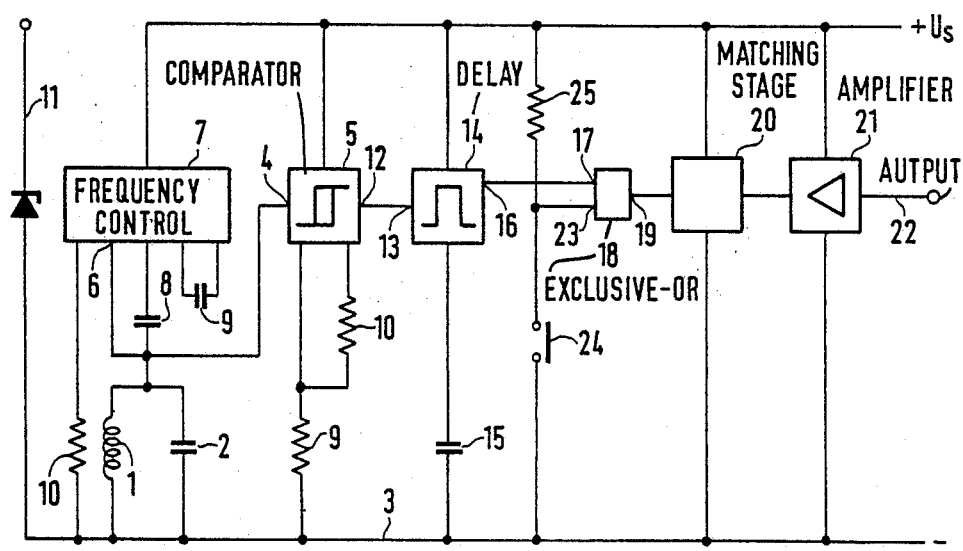

NONCONTACT ELECTRONIC SWITCHING ARRANGEMENT

This is a continuation of co-pending application Ser. No. 498,586, filed on May 26, 1983, now abandoned.

BACKGROUND OF THE INVENTION

This invention relates generally to electronic arrangements which operate without making contact using proximity devices, and more particularly, to a switching arrangement having a resonant circuit which can be damped externally, an evaluation circuit, and an amplifier.

As used herein, the term "evaluation circuit" refers to a circuit for converting the output of the resonant circuit to a binary signal indicating whether an actuator is near the switch.

A known switching arrangement of the type mentioned hereinabove is described in German Pat. No. 20 54 100. In this known arrangement, a feedback oscillator is provided which can be damped by external objects. The resonant frequency of the oscillator depends upon the tolerance of the coil and the capacitor, as well as the customary components, so that the amplitude of the oscillation can change independently of objects brought in the proximity of the oscillator.

It is, therefore, an object of this invention to develop an arrangement of the aforementioned type having an oscillation amplitude which is as constant as possible in the undamped condition of the resonant circuit.

It is a further object of this invention to provide an arrangement of the type discussed hereinabove which operates substantially independently of external influences such as humidity, temperature, and the influence of adverse characteristics in its circuit components.

It is still a further object of this invention to provide an electronic switching arrangement having high sensitivity so as to operate over a large switching range.

SUMMARY OF THE INVENTION

The foregoing and other objects are achieved by this invention which provides, in a simple manner, a resonant circuit which is excited externally.

In a particularly advantageous embodiment of the invention, the inventive circuit is improved by adding a frequency control arrangement to the externally excited resonant circuit. If a well known phase-locked loop (PLL) circuit is used as the frequency control arrangement, an advantageous result is produced in that the resonant circuit is always retuned to its resonant frequency, and thereby the amplitude changes are reduced to a minimum. The PLL consists here essentially of a voltage-controlled oscillator (VCO), the resonant circuit to be excited, a phase measuring element, and a low pass filter (See, for example, Der Elektroniker No. 6, 1975, pages EL9 to EL15).

It is a further advantage of the externally excited resonant circuit that the oscillations do not decay when damped by metals, but only a reduction in the amplitude is produced. Thus, the build-up time of the resonant circuit is reduced to a minimum so that the switching frequency is lower than the oscillator frequency by a factor corresponding only to the "noise immunity."

A demodulation method has been used heretofore for processing the oscillator signal. In the method, which is described in German Pat. No. 20 54 100, the AC voltage is first rectified and then smoothed. However, this results in a loss of sensitivity, particularly as a result of the above-mentioned temperature and other environmental influences on the components. In the present invention, however, since the resonant circuit is connected without rectification via a reference voltage comparator circuit to a Schmitt trigger output, such problems are therefore solved. It is therefore possible to evaluate these pulses in a simple manner if a retriggerable time delay circuit is added to the Schmitt trigger output. Alternatively, purely digital operation can be achieved by using instead of the retriggerable time delay circuit a four-bit shift register having a serial input and parallel outputs, the outputs being evaluated via an AND gate. With such operation, four pulses are always required before the proximity or absence of an actuator will be recognized. Additionally, switching frequencies of several kHz can be achieved, as compared to a switching frequency of only several hundred Hz achievable with known oscillators. In order that the output of the switching arrangement of the invention be preprogrammed for digital signals type "0" and "1", it is advantageous if the digitized output is connected to an input of an exclusive-OR stage, the other input receiving a signal voltage which can be applied at will. The exclusive-OR stage is known, and is available as an MOS standard module. Thus, it is possible to connect the now digitized switching arrangement which operates without making contact, to digital equipment without difficulty. A matching stage or preamplifier and an amplifier can be connected to the exclusive-OR gate.

BRIEF DESCRIPTION OF THE DRAWING

Comprehension of the invention is facilitated by reading the following detailed description in conjunction with the annexed drawings.

FIG. 1 is a schematic and function block representation of a circuit arrangement constructed in accordance with the principles of the invention.

FIG. 2 schematically shows a circuit which may be used as a delay element in accordance with the present invention.

DETAILED DESCRIPTION

A resonant circuit consisting of a coil 1 and a capacitor 2 is connected on one side thereof to a minus line 3, and on the other side thereof to an input 4 of a reference voltage comparator circuit 5. The resonant circuit is further connected to an input 6 of a frequency control 7. Frequency control 7 is, in this embodiment, a phase-locked loop circuit of the type which is known, for example, from the publication "Theory and Application of the Phase-Locked Loop." The resonant circuit is further connected to a capacitor 8 which cooperates with the resonant circuit as a phase measuring capacitor. The reference voltage comparator circuit 5 is connected to a resistor 9 which is connected on one side to minus line 3 which bears a reference potential. Thus, the sensitivity can be adjusted. A further resistor 30 is used as a hysteresis resistance. The reference voltage can be adjusted externally via a line 11.

The reference voltage comparator circuit 5 has a Schmitt trigger output 12 and, as described in the foregoing publication, is connected, illustratively to an input 13 of a retriggerable time delay stage 14. Time delay stage 14 is connected to minus line 3 via a capacitor 14 which determines the timing pulses. An output 16 of the retriggerable time delay stage is connected to an input 17 of an exclusive-OR stage 18 which provides at an output 19 thereof an output signal 22 via a matching stage 20 and an amplifier 21.

It is also contemplated within the scope of this invention that a shift register having a serial input and parallel logic outputs be utilized to obtain interference suppression. Such a shift register and its connection to the remainder of the circuit is shown in FIG. 2 as 38. It comprises a serial input 40, a clock input 42, and four parallel outputs 44. The serial input 40 is connected to the input 13 of delay 14, and the clock input 42 is connected to a clock driver (not shown) and ultimately to the resonant circuit. The parallel outputs 44 are connected respectively to four inputs of an AND gate 46, the output of which is connected to the output 16 of delay 14. Whether output signal 22 is positive or negative depends upon the connections to second input 23 of exclusive-OR stage 18. In the state shown in FIG. 1, a logic 0 signal is present at input 23. After a programming switch 24 is opened, however, a resistor 25 provides a logic 1 input 23. The output 19 of Exclusive-OR stage 18 will follow the logic level of input 17 if input 23 is at logic "0", and will invert the logic level of input 17 if the input 23 is at logic "1". In other words, an output signal is produced if the programming switch 24 is closed and if the resonant circuit is not damped. Also, if switch 24 is open, a signal 22 appears if damping is applied.

The operation of the switching arrangement according to the invention is as follows: as long as the resonant circuit oscillates undamped by external objects, every pulse is compared with the reference voltage in the reference voltage comparator circuit. If the pulses, illustratively in the undamped condition, reach a corresponding amplitude, such pulses are passed on. Retriggerable time delay stage 14 receives a corresponding pulse during each half-wave. The delay time of the retriggerable time delay stage is longer than the period of the oscillator oscillation, and therefore, a continuous signal is obtained at output 16. Alternatively, the pulses may be fed to a shift register delay such as that shown in FIG. 2. That circuit will output a continuous logic "1" signal after the serial input 40 is active for four successive clock pulses. This output signal is processed further, as mentioned hereinabove, via exclusive-OR stage, matching stage 20, and amplifier 21. If the pulses entering input 4 of the comparitor are damped, i.e., below the reference voltage, then no indication of their presence will appear at the output 12. The delay 14 will therefore not be triggered, and the output 22 will remain at the logic level corresponding to damped oscillations as hereinbefore described. In order to avoid error pulses, the retriggerable time delay responds only after a sequence of several pulses, illustratively three pulses.

It is also possible that the output signal 22 switches a thyristor or a Triac connected to the voltage supply for operating the series-connected load, so that the switching device, according to the invention, can also be used as a two-wire switching device. The essential components of the switching device according to the invention can be combined without difficulty in an integrated circuit so that a physically small and simple construction is possible.

Although the invention has been described in terms of specific embodiments and applications, persons skilled in the art, in light of this teaching, can generate additional embodiments without exceeding the scope or departing from the spirit of the claimed invention. Accordingly, it is to be understood that the drawing and description in this disclosure are proffered to facilitate comprehension of the invention and should not be construed to limit the scope thereof.

What is claimed is:

1. An electronic noncontact switching device responsive to external objects comprising:
   a resonator circuit with an output point for generating a signal having a voltage amplitude damped by said external objects, and a resonance frequency, said resonator circuit being connected between said output point and ground;
   a condensor for exciting said resonator circuit connected to said resonator circuit at said output point;
   an oscillator whose frequency is controlled according to said resonance frequency and is connected through said condensor to said resonator circuit; and
   an evaluation circuit connected to said output point for detecting said voltage amplitude.

2. The device of claim 1 wherein said evaluation circuit comprises a reference voltage comparator connected to said output point and having a Schmitt trigger output.

3. The device according to claim 1 wherein said oscillator circuit includes a frequency control circuit comprising a phase-locked loop.

4. The device of claim 2 further having a retriggerable time delay stage connected to said Schmitt trigger output.

5. The device of claim 2 wherein said Schmitt trigger output is connected to a shift register.

6. The device of claim 4 wherein said delay stage has a delay output, said device further comprising an exclusive or gate stage having said delay output as one input and a control signal as a second input.

7. The device of claim 5 wherein said shift register has an output, said device further comprising an exclusive or gate stage having said shift register output as one input and a control signal as a second input.

* * * * *